United States Patent
Hwang et al.

(10) Patent No.: US 9,391,172 B2
(45) Date of Patent: Jul. 12, 2016

(54) METHODS OF SHAPING A CHANNEL REGION IN A SEMICONDUCTOR FIN USING DOPING

(71) Applicant: Samsung Electronics Co., Ltd., Suwon-si (KR)

(72) Inventors: Heedon Hwang, Yongin-si (KR); Dongkak Lee, Hwaseong-si (KR); Min-Kyoung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/561,360

(22) Filed: Dec. 5, 2014

(65) Prior Publication Data

US 2015/0270345 A1  Sep. 24, 2015

(30) Foreign Application Priority Data

Mar. 21, 2014 (KR) .................. 10-2014-0033484

(51) Int. Cl.
| | |
|---|---|
| *H01L 29/10* | (2006.01) |
| *H01L 29/06* | (2006.01) |
| *H01L 21/02* | (2006.01) |
| *H01L 29/66* | (2006.01) |
| *H01L 29/78* | (2006.01) |
| *H01L 29/161* | (2006.01) |

(52) U.S. Cl.
CPC ...... *H01L 29/66795* (2013.01); *H01L 29/1033* (2013.01); *H01L 29/161* (2013.01); *H01L 29/7851* (2013.01); *H01L 29/7854* (2013.01)

(58) Field of Classification Search
CPC ............ H01L 29/7851; H01L 29/1033; H01L 29/161; H01L 29/66795; H01L 29/0653; H01L 21/02667; H01L 21/02532; H01L 21/02529; H01L 29/66545; H01L 29/1054; H01L 29/785; H01L 29/66666; H01L 27/1211
USPC .......................................... 438/283; 257/401
See application file for complete search history.

(56) References Cited

U.S. PATENT DOCUMENTS

| | | | |
|---|---|---|---|
| 4,228,447 | A | 10/1980 | Sato et al. |
| 6,465,315 | B1 | 10/2002 | Yu |
| 6,921,982 | B2 | 7/2005 | Joshi et al. |
| 7,154,118 | B2 | 12/2006 | Lindert et al. |
| 7,323,710 | B2 | 1/2008 | Kim et al. |
| 7,960,794 | B2 | 6/2011 | Doyle et al. |
| 7,972,914 | B2 | 7/2011 | Kim et al. |
| 8,076,231 | B2 | 12/2011 | Saitoh et al. |
| 8,237,226 | B2 | 8/2012 | Okano |
| 8,373,226 | B2 | 2/2013 | Taketani |
| 8,415,216 | B2 | 4/2013 | Anderson et al. |

(Continued)

FOREIGN PATENT DOCUMENTS

| | | |
|---|---|---|
| JP | 2009-021456 | 1/2009 |
| JP | 2009-239167 | 10/2009 |

(Continued)

*Primary Examiner* — Evan Pert
*Assistant Examiner* — Changhyun Yi
(74) *Attorney, Agent, or Firm* — Myers Bigel Sibley & Sajovec, P.A.

(57) ABSTRACT

Provided is a method of fabricating a transistor. The method includes forming a fin portion protruding upward from a substrate, forming a device isolation pattern on the substrate to cover a lower portion of a sidewall of the fin portion, forming a trench in the device isolation pattern, the trench exposing a top surface and sidewalls of a channel region of the fin portion, and injecting a Group-IV element into the channel region of the fin portion to increase the volume of the channel region.

18 Claims, 20 Drawing Sheets

(56) References Cited

U.S. PATENT DOCUMENTS

| | | | |
|---|---|---|---|
| 8,435,847 B2 | 5/2013 | Chun | |
| 8,492,219 B2 | 7/2013 | Saitoh et al. | |
| 2006/0231907 A1 | 10/2006 | Kim et al. | |
| 2011/0227162 A1 | 9/2011 | Lin et al. | |
| 2012/0052664 A1 | 3/2012 | Fuse et al. | |
| 2014/0252475 A1* | 9/2014 | Xu | H01L 29/785 257/347 |
| 2015/0228731 A1* | 8/2015 | Hsiao | H01L 29/36 257/401 |

FOREIGN PATENT DOCUMENTS

| | | |
|---|---|---|
| JP | 2011-054629 | 3/2011 |
| KR | 10-0487566 | 4/2005 |
| KR | 10-0773009 | 10/2007 |
| KR | 10-0845175 | 7/2008 |
| KR | 1020120020062 A | 3/2012 |
| KR | 10-1154915 | 6/2012 |
| KR | 1020120122776 A | 11/2012 |
| WO | WO 2008/042591 A2 | 4/2008 |

* cited by examiner

METHODS OF SHAPING A CHANNEL REGION IN A SEMICONDUCTOR FIN USING DOPING

CROSS-REFERENCE TO RELATED APPLICATION

This U.S. non-provisional patent application claims priority under 35 U.S.C. §119 to Korean Patent Application No. 10-2014-0033484, filed on Mar. 21, 2014, in the Korean Intellectual Property Office, the entire contents of which are hereby incorporated herein by reference.

BACKGROUND

The present disclosure relates to transistors. Semiconductor devices are increasingly being used in consumer, industrial, and other electronic devices. The semiconductor devices may be classified as a memory device for storing data, a logic device for processing data, or a hybrid device including both of memory and logic elements. Due to the increased demand for electronic devices with fast speed and/or low power consumption, the semiconductor devices may benefit from providing high reliability, high performance, and/or multiple functions. To satisfy these technical requirements, complexity and/or integration density of semiconductor devices may increase.

SUMMARY

Example embodiments of the inventive concept provide a transistor having a channel region with increased width.

Some example embodiments of the inventive concept provide a method of forming a transistor with improved reliability.

According to example embodiments of the inventive concept, a method of forming a transistor may include forming a fin portion protruding upward from a substrate, forming a device isolation pattern on the substrate to cover a sidewall of the fin portion, forming a trench in the device isolation pattern, the trench exposing a top surface and sidewalls of a channel region of the fin portion, and injecting a Group-IV element into the channel region of the fin portion to increase the volume of the channel region.

In example embodiments, an edge of the fin portion of which the volume has increased may be more rounded than an edge of the fin portion of which the volume has not increased yet.

In example embodiments, the Group-IV element may be injected into the channel region at a dose of about $5 \times 10^{19}$ atoms/cm$^3$ to about $5 \times 10^{21}$ atoms/cm$^3$.

In example embodiments, the Group-IV element may be injected at a tilted angle with respect to a direction normal (e.g., perpendicular) to a top surface of the substrate.

In example embodiments, the method may further include crystallizing the fin portion after the injecting the Group-IV element.

In example embodiments, the method may further include forming a gate insulating layer within the trench, the gate insulating layer covering the top surface and sidewalls of the channel region of which the volume has increased, and forming a gate electrode on the gate insulating layer.

In example embodiments, the method may further include recessing the channel region to form a recessed channel region of which a top surface is lower than those of source/drain regions disposed at both sides of the fin portion. The injecting the Group-IV element may be performed on the recessed channel region.

In example embodiments, the Group-IV element includes silicon, germanium, and/or carbon.

In example embodiments, the fin portion includes a lower portion covered with the device isolation pattern and an upper portion exposed by the device isolation pattern. A maximum width of the upper portion of the fin portion that is injected by the Group-IV element is greater than a width of the lower portion of the fin portion.

According to some example embodiments of the inventive concept, a method of forming a transistor may include forming a fin portion protruding upward from a substrate, forming a mask pattern to cover both sides of the fin portion and expose a channel region of the fin portion, rounding an edge of the channel region to increase a volume of the channel region more than that of the channel region prior to forming the rounded edge, and forming a gate electrode on the channel region with the rounded edge.

In example embodiments, the rounding of the edge of the channel region may include injecting a Group-IV element into the channel region.

In example embodiments, the rounding of the edge of the channel region may further include crystallizing the channel region into which the Group-IV element has been injected.

In example embodiments, the injecting of the Group-IV element may be performed using a tilted ion injection technique.

In example embodiments, the method may further include forming a gate insulating layer between the channel region of the fin portion and the gate electrode, the gate insulating layer extending along the rounded edge of the channel region.

In example embodiments, the method may further include recessing the channel region below top surfaces of both end portions of the fin portion, prior to the rounding the edge of the channel region.

According to some example embodiments of the inventive concept, a transistor may include a substrate having a protruding fin portion, a device isolation pattern covering a lower portion of a sidewall of the fin portion, a gate electrode provided on the substrate to cross the fin portion, and a gate insulating layer interposed between the fin portion and the gate electrode. A concentration of a Group-IV element contained in the fin portion may be higher in a portion exposed by the device isolation pattern than in another portion covered with the device isolation pattern, and the Group-IV element may comprise silicon, germanium and/or carbon.

In example embodiments, the fin portion may include an active fin exposed by the device isolation pattern and a surface portion of the active fin may contain the Group-IV element at a higher concentration than a core portion of the active fin.

In example embodiments, an edge of the active fin may contain the Group-IV element at a higher concentration than a top surface of the active fin.

In example embodiments, the fin portion may include source/drain regions disposed at both sides of the gate electrode and a channel region interposed between the source/drain regions, and a top surface of the channel region of the fin portion may be positioned at a higher level than a top surface of each source/drain region of the fin portion.

In example embodiments, the fin portion may include source/drain regions and a channel region, and the channel region may contain the Group-IV element at a higher concentration than the source/drain regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
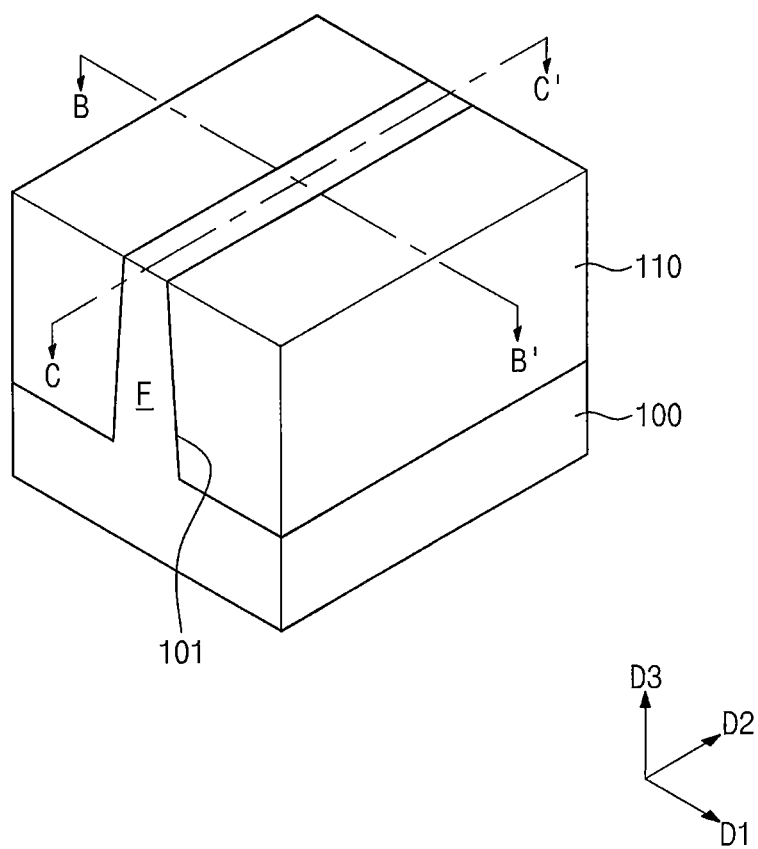
FIGS. 1A, 2A, 3A, and 4A are perspective views illustrating a process of forming a transistor according to example embodiments of the inventive concept.

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A, 2A, 3A, and 4A are perspective views illustrating a process of forming a transistor according to example embodiments of the inventive concept. FIGS. 1B, 2B, 3B, and 4B are sectional views taken along lines B-B' of FIGS. 1A, 2A, 3A, and 4A, respectively, and FIGS. 1C, 2C, 3C, and 4C are sectional views taken along lines C-C' of FIGS. 1A, 2A, 3A, and 4A, respectively.

Figure 1B:
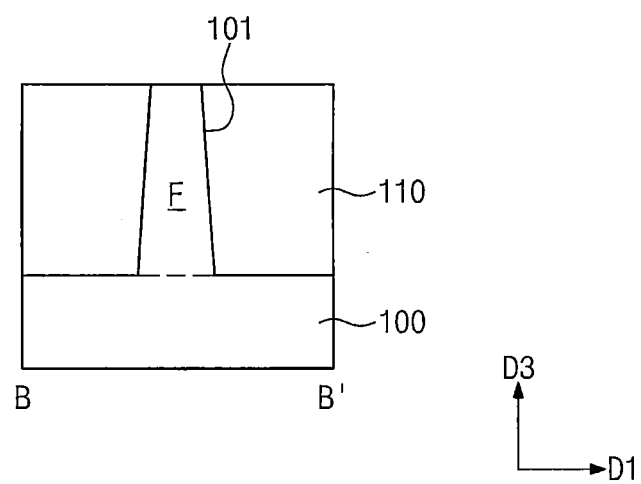
FIGS. 1B, 2B, 3B, and 4B are sectional views taken along lines B-B' of FIGS. 1A, 2A, 3A, and 4A, respectively.
Figure 1C:
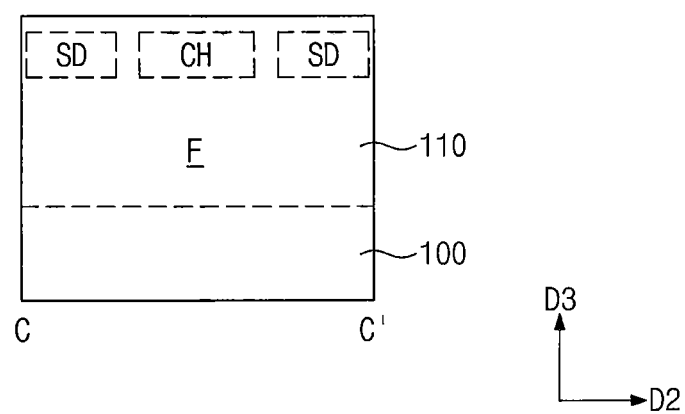
FIGS. 1C, 2C, 3C, and 4C are sectional views taken along lines C-C' of FIGS. 1A, 2A, 3A, and 4A, respectively.

Referring to FIGS. 1A through 1C, a fin portion F protruding from a substrate 100 may be formed. The fin portion F may extend in a direction D2. The substrate 100 may be a silicon wafer or a silicon-on-insulator (SOI) wafer. As an example, the formation of the fin portion F may include forming a mask layer on the substrate 100 and forming a trench 101 in the substrate 100 using the mask layer as an etch mask. In the case where the substrate 100 is a SOI substrate including first and second semiconductor layers and a dielectric layer interposed therebetween, the second semiconductor layer disposed on the dielectric layer may be patterned to form the fin portion F.

A device isolation pattern 110 may be formed to fill the trench 101. The device isolation pattern 110 may be or include a high-density plasma (HDP) oxide layer, a spin-on-glass (SOG) layer, and/or a chemical vapor deposition (CVD) oxide layer. The device isolation pattern 110 may be formed to cover sidewalls of the fin portion F within the trench 101. In some embodiments, the formation of the fin portion F may include forming a mask layer on a top surface of the substrate 100 and performing an epitaxial process using a top surface of the substrate 100, which is exposed by the mask layer, as a seed layer. In this case, the fin portion F may be formed of the same material as the substrate 100 or a material having a different lattice constant and/or a different band gap from the substrate 100. As an example, the substrate 100 may be a single crystalline silicon substrate, and the fin portion F may include germanium (Ge), silicon germanium (SiGe), or silicon carbide (SiC).

A doping process may be performed to form source/drain regions SD in both ends of the fin portion F. As an example, a dopant may be injected into both ends of the fin portion F. As the result of the formation of the source/drain regions SD, a channel region CH may be formed in a portion of the fin portion F between the source/drain regions SD. The dopant may be a Group-III element, such as boron (B). As another example, the dopant may be a Group-V element, such as phosphorus (P) or arsenic (As). The doping process may be performed before or after forming the device isolation pattern 110.

Figure 2A:
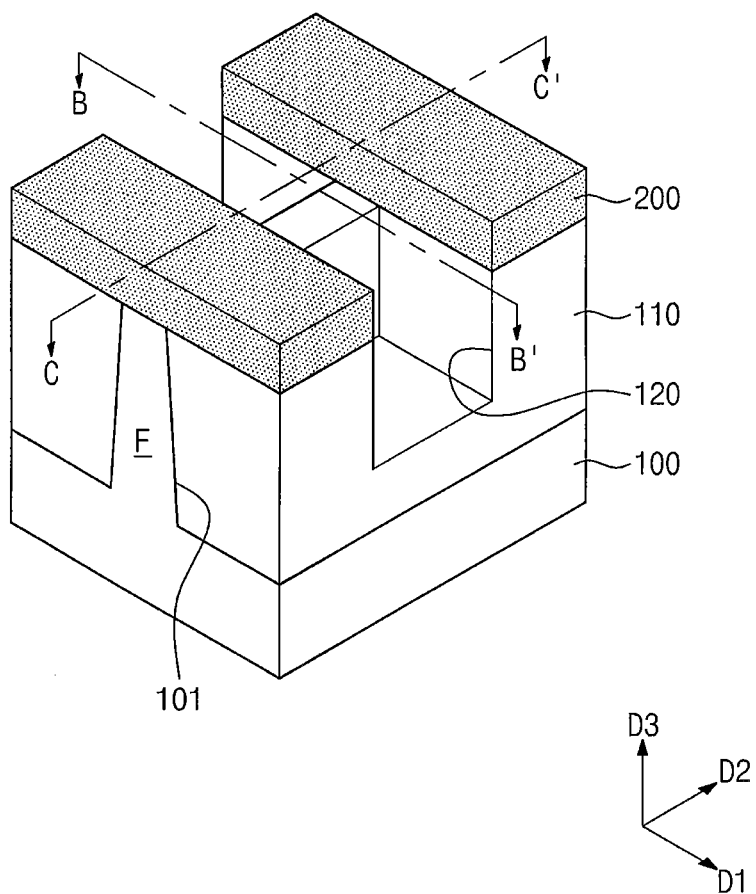
Figure 2B:
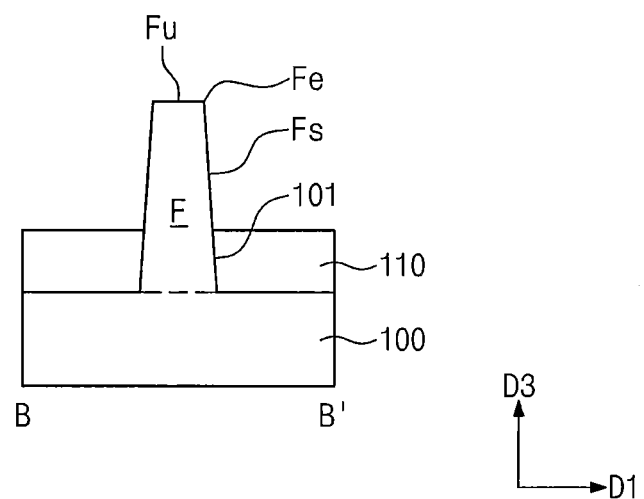
Figure 2C:
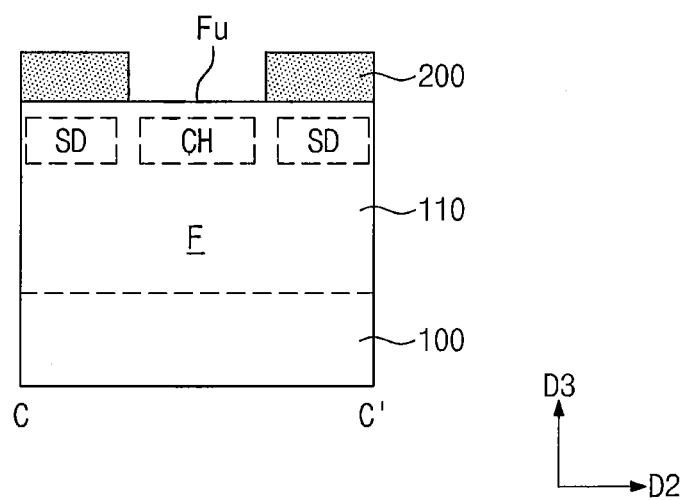

Referring to FIGS. 2A through 2C, a gate trench 120 may be formed in the device isolation pattern 110. The gate trench 120 may extend in a direction D1. For example, to form the gate trench 120, a mask pattern 200 may be formed on the device isolation pattern 110. The mask pattern 200 may cover the source/drain regions SD of the fin portion F and expose the channel region CH. The device isolation pattern 110 may be etched using the mask pattern 200. Accordingly, the gate trench 120 may be formed. The gate trench 120 may expose both sidewalls Fs and a top surface Fu of the channel region CH of the fin portion F. The fin portion F may have edges Fe where the top surface Fu meets the sidewalls Fs. The fin portion F may have a small radius of curvature at the edges Fe. A bottom surface of the gate trench 120 may be at a higher level than a bottom surface of the device isolation pattern 110. In this case, an additional mask pattern may be formed on the channel region CH of the fin portion F. Accordingly, the top surface Fu of the channel region CH of the fin portion F may not be etched.

Figure 3A:
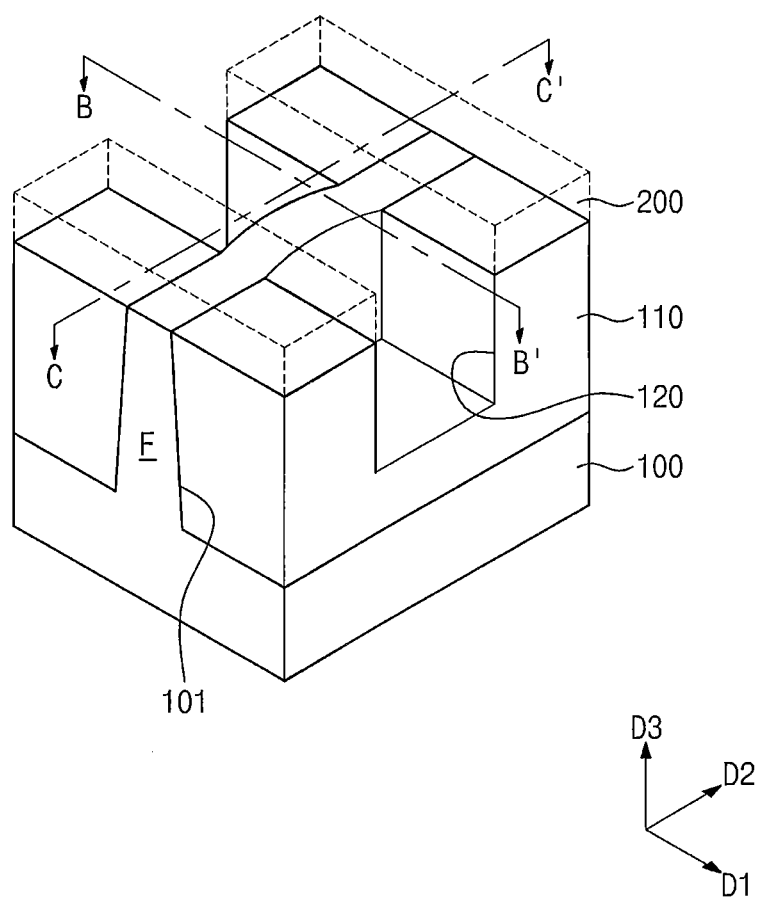
Figure 3B:
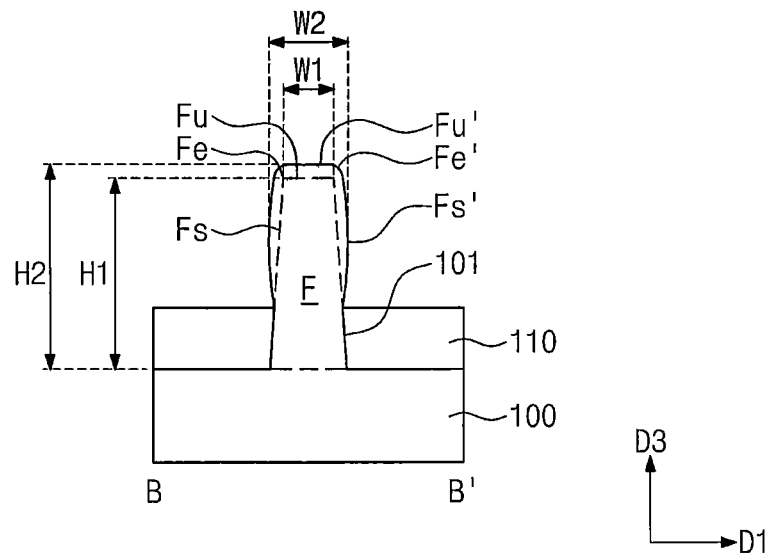
Figure 3C:
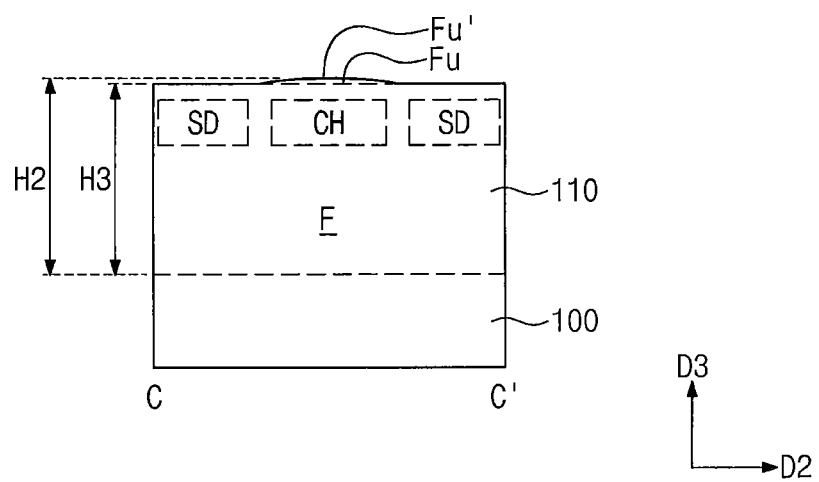

Referring to FIGS. 3A through 3C, an injection process of a Group-IV element may be performed to increase the volume of the fin portion F, e.g., the channel region. For example, the Group-IV element may be injected into a portion of the fin portion F exposed by the device isolation pattern 110. As shown in FIG. 3B, a height H2 of the fin portion F into which the Group-IV element has been injected may be greater than a height H1 of the fin portion F (as denoted by a dotted line) into which the Group-IV element has not been injected yet. A top surface Fu' of the fin portion F into which the Group-IV element has been injected may be at a higher level than the top surface Fu of the fin portion F into which the Group-IV element has not been injected yet. A width W2 of the fin portion F into which the Group-IV element has been injected may be greater than a width W1 of the fin portion F into which the Group-IV element has not been injected yet. The widths W1 and W2 may refer to widths of the fin portion F exposed by the device isolation pattern 110, which may be measured at the same level. Edges Fe' of the fin portion F into which the Group-IV element has been injected may be more rounded than the edges Fe of the fin portion F into which the Group-IV element has not been injected yet. In some embodiments, the Group-IV element may be injected into the channel region CH of the fin portion F at a dose of about $5 \times 10^{19}$ atoms/cm$^3$ to about $5 \times 10^{21}$ atoms/cm$^3$, specifically, a dose of about $5 \times 10^{20}$ atoms/cm$^3$. In the case where the dose is less than about $5 \times 10^{19}$ atoms/cm$^3$, the volume of the fin portion F may not be sufficiently increased, or the edges Fe' of the fin portion F may not be sufficiently rounded.

The ion injection process may lead to an increase in the number of Group-IV elements contained in the fin portion F, and this may lead to an increase in the volume of the fin portion F or the channel region CH. In example embodiments, the fin portion F may be formed of or include silicon, and the Group-IV element may include silicon (Si), germanium (Ge), and/or carbon (C). The fin portion F may have a damaged crystal structure, as the result of the injection of the Group-IV element. For example, the fin portion F into which the Group-IV element has been injected may have an amorphous surface. The number of elements per unit volume in the amorphous fin portion F may be increased by injecting the Group-IV element. After the Group-IV element is injected, a process of crystallizing the fin portion F may be performed. For example, the fin portion F may be crystallized using a solid-phase epitaxy (SPE) process. As the result of the crystallization of the fin portion F, the volume of the fin portion F may be increased, because, for the crystallized fin portion F, the number of elements per unit volume thereof is given as a specific value. In other words, according to example embodiments of the inventive concept, the fin portion F can be formed to have an increased channel width. This makes it possible to improve on-current characteristics of the transistor. Unlike the dopants such as Group-III or V elements, the Group-IV element may not affect threshold voltage characteristics of the channel region CH.

In example embodiments, in the case where germanium is used as the Group-IV element in the injection process, the concentration of germanium may be higher in the fin portion F exposed by the device isolation pattern 110 than in the fin portion F covered with the device isolation pattern 110. Further, the concentration of germanium may be higher in a surface portion of the fin portion F exposed by the device isolation pattern 110 than in a core portion of the fin portion F exposed by the device isolation pattern 110. In some embodiments, in the case where carbon is used as the Group-IV element in the injection process, the concentration of carbon may be higher in the fin portion F exposed by the device isolation pattern 110 than in the fin portion F covered with the device isolation pattern 110. The concentration of carbon may be higher in the surface portion of the fin portion F exposed by the device isolation pattern 110 than in the core portion of the fine portion F exposed by the device isolation pattern 110.

As the result of the use of the mask pattern 200, the Group-IV element may not be injected into the source/drain regions SD of the fin portion F. Accordingly, the volumes of the source/drain regions SD of the fin portion F may not increase during the injection of the Group-IV element. As shown in FIG. 3C, the height H2 of the channel region CH of the fin portion F may be higher than a height H3 of the source/drain regions SD of the fin portion F. In example embodiments, the channel region CH of the fin portion F may have a higher germanium concentration than the source/drain regions SD of the fin portion F. In some embodiments, the channel region CH of the fin portion F may have a higher carbon concentration than the source/drain regions SD of the fin portion F.

In some embodiments, a dopant may be further injected into the channel region CH of the fin portion F. The dopant may be a Group-III element or a Group-V element. By performing such a dopant injection process, it is possible to control threshold voltage characteristics of the channel region CH. The dopant injection process may be performed under different dose conditions from the process of injecting the Group-IV element. For example, the dopant injection process may be performed at a dose ranging from about $10^{17}$ atoms/cm$^3$ to about $10^{18}$ atoms/cm$^3$. The dopant injection process may be performed after the process of injecting the Group-IV element and the process of crystallizing the channel region CH. In some embodiments, the dopant injection process may be omitted. Thereafter, the mask pattern 200 may be removed.

Figure 3D:
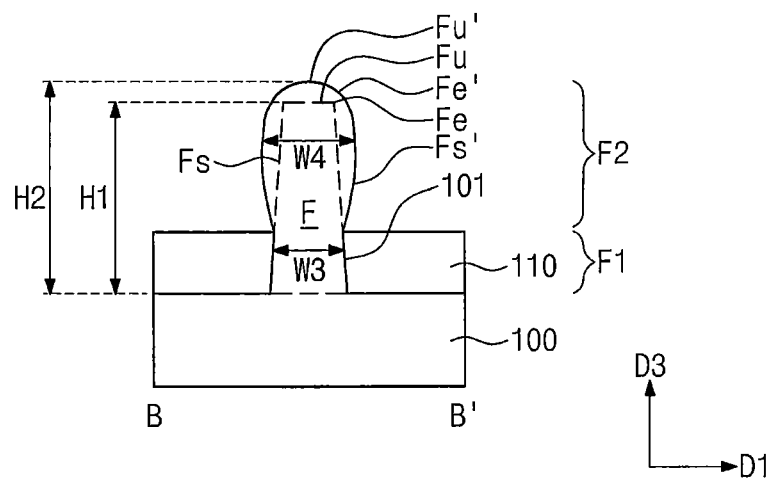
FIG. 3D is a sectional view illustrating a fin portion according to some example embodiments of the inventive concept.

FIG. 3D is a sectional view illustrating a fin portion according to some example embodiments of the inventive concept.

Referring to FIG. 3D, the fin portion F may include a lower fin F1 and an upper fin F2. Sidewalls of the lower fin F1 may be covered with the device isolation pattern 110. Sidewalls Fs of the upper fin F2 may be exposed by the device isolation pattern 110. The upper fin F2 may be used as a fin-shaped active region of the transistor. The Group-IV element may be injected into the upper fin F2 exposed by the device isolation pattern 110. Accordingly, the volume of the upper fin F2 may increase, while the volume of the lower fin F1 may not increase. In the present embodiment, a maximum width W4 of the upper fin F2 may be greater than a width W3 of a top portion of the lower fin F1.

Figure 3E:
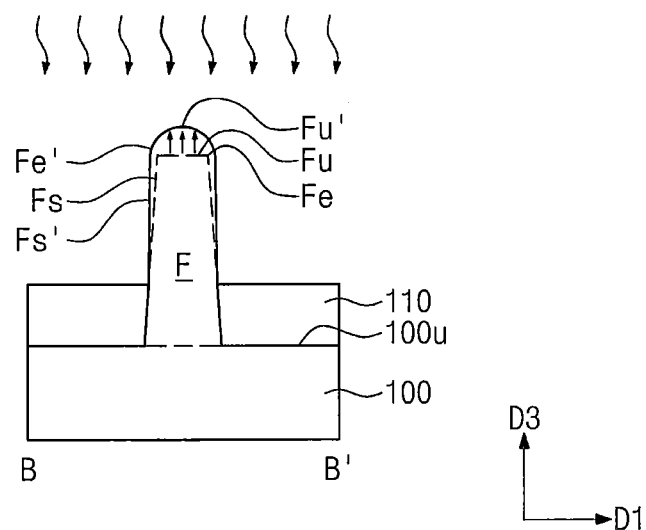
FIGS. 3E and 3F are sectional views illustrating an ion injection process, according to example embodiments of the inventive concept.
Figure 3F:
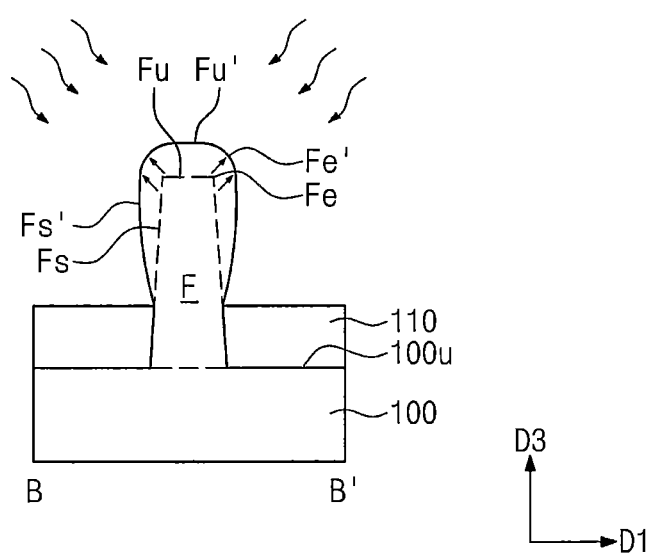

FIGS. 3E and 3F are sectional views illustrating an ion injection process, according to example embodiments of the inventive concept. An ion injection process according to example embodiments of the inventive concept will be described in more detail with reference to FIGS. 3E and 3F.

Referring to FIG. 3E, a Group-IV element may be injected in a direction normal (e.g., perpendicular) to a top surface 100u of a substrate 100. Accordingly, an injection amount of the Group-IV element may be higher in a surface of a fin portion F normal (e.g., perpendicular) to the injection direction of the Group-IV element than other surfaces of the fin portion F. As a result, an increment in the volume of the fin portion F may be greater at the surface of the fin portion F normal (e.g., perpendicular) to the injection direction of the Group-IV element than at the other surfaces of the fin portion F. For example, the volume expansion may be greater at the top surface Fu of the fin portion F than at the sidewalls Fs of the fin portion F. The volume expansion of the fin portion F may be dominant in a direction D3 parallel to the injection direction of the Group-IV element.

Referring to FIG. 3F, the Group-IV element may be injected into the channel region CH of the fin portion F using a tilted ion injection technique. For example, the Group-IV element may be injected in a direction that is at an angle to the top surface 100u of the substrate 100. Accordingly, the volume of the fin portion F may increase toward the tilted injection direction of the Group-IV element. An increment in the volume of the fin portion F in the tilted injection direction may be greater than an increment in the volume of the fin portion F in other directions. Accordingly, edges Fe' of the fin portion F that is injected by the Group-IV element in the tilted direction may be more rounded. When germanium is injected, the edges Fe' of the channel region CH may have a higher germanium concentration than the top surface Fu' of the channel region CH. As another example, the edges Fe' of the channel region CH may have a higher carbon concentration than the top surface Fu' of the channel region CH.

According to example embodiments of the inventive concept, a direction in which the volume of the fin portion F increases may be adjusted by controlling the injection direction of the Group-IV element. An extent to which the edges Fe of the fin portion F are rounded may be adjusted by controlling the injection direction of the Group-IV element. For example, the Group-IV element may be simultaneously injected into the fin portion F in the direction normal (e.g., perpendicular) to the top surface 100u of the substrate 100 and in the tilted directions. As another example, the Group-IV element may be injected into the fin portion F in the direction normal (e.g., perpendicular) to the top surface 100u of the substrate 100, and then, the Group-IV element may be injected into the fin portion F in titled directions with respect to the direction normal (e.g., perpendicular) to the top surface 100u of the substrate 100.

Figure 4A:
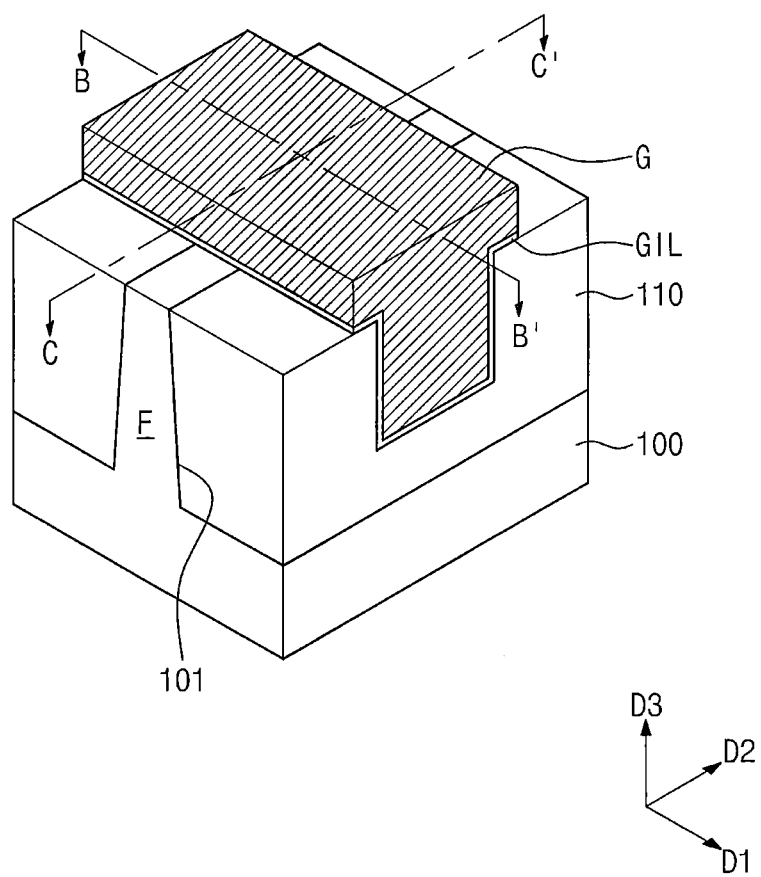
Figure 4B:
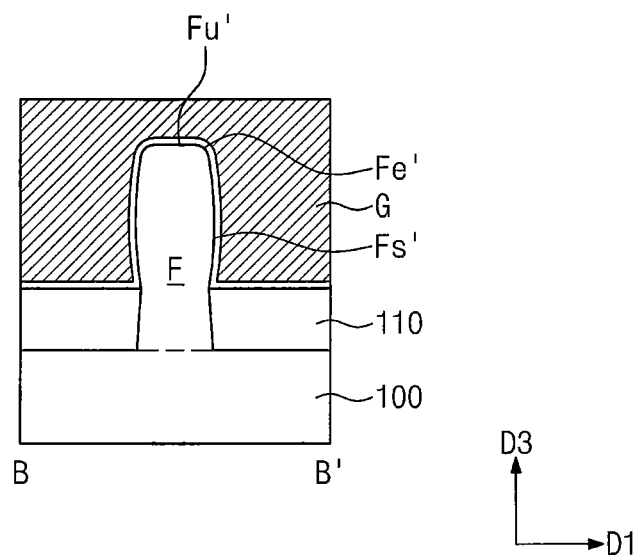
Figure 4C:
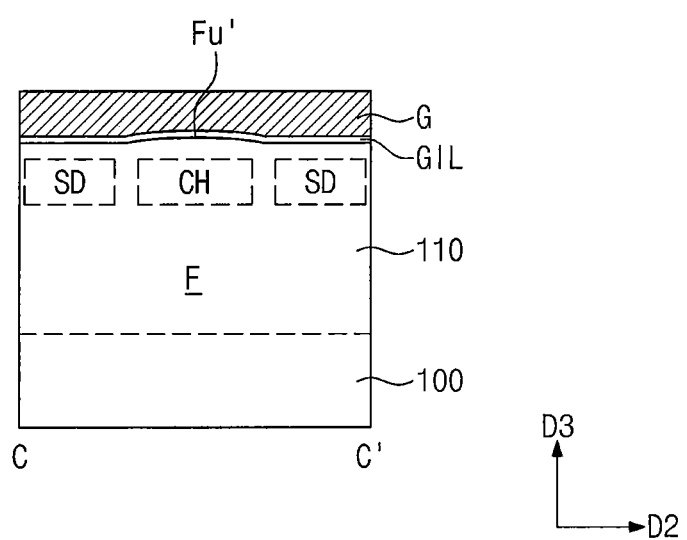

Referring to FIGS. 4A through 4C, a gate insulating layer GIL and a gate electrode G may be formed within the gate trench 120. For example, the gate insulating layer GIL may conformally cover the top surface Fu' and sidewalls Fs' of the fin portion F within the gate trench 120. When the fin portion F has a small radius of curvature at the edges Fe, the gate insulating layer GIL disposed on the edges Fe of the fin portion F may have a smaller thickness than the gate insulating layer GIL disposed on the top surface Fu and the sidewalls Fs of the fin portion F. This may lead to degradation in reliability of a transistor. According to example embodiments of the inventive concept, since the edges Fe' of the channel region CH of the fin portion F are rounded, the gate insulating layer GIL may be formed to a more uniform thickness. For example, the gate insulating layer GIL disposed on the edges Fe' of the fin portion F may have substantially the same thickness as the gate insulating layer GIL disposed on the top surface Fu' and sidewall Fs' of the fin portion F. Further, since the edges Fe' of the fin portion F of the inventive concept are rounded, it is possible to prevent/impede an electric field from being concentrated at the edges Fe' of the fin portion F. This makes it possible to improve threshold voltage properties and reliability of the transistor. The gate electrode G may be formed on the gate insulating layer GIL. The gate electrode G may be formed to fill the gate trench 120. The gate electrode G may further include portions extending onto the device isolation pattern 110. The gate electrode G may include a conductive material.

FIGS. 5A, 6A, 7A, and 8A are perspective views illustrating a process of forming a transistor according to some example embodiments of the inventive concept. FIGS. 5B, 6B, 7B, and 8B are sectional views taken along lines B-B' of FIGS. 5A, 6A, 7A, and 8A, respectively, and FIGS. 5C, 6C, 7C, and 8C are sectional views taken along lines C-C' of FIGS. 5A, 6A, 7A, and 8A, respectively. Hereinafter, repeated descriptions of what is described above may be omitted.

Figure 5A:
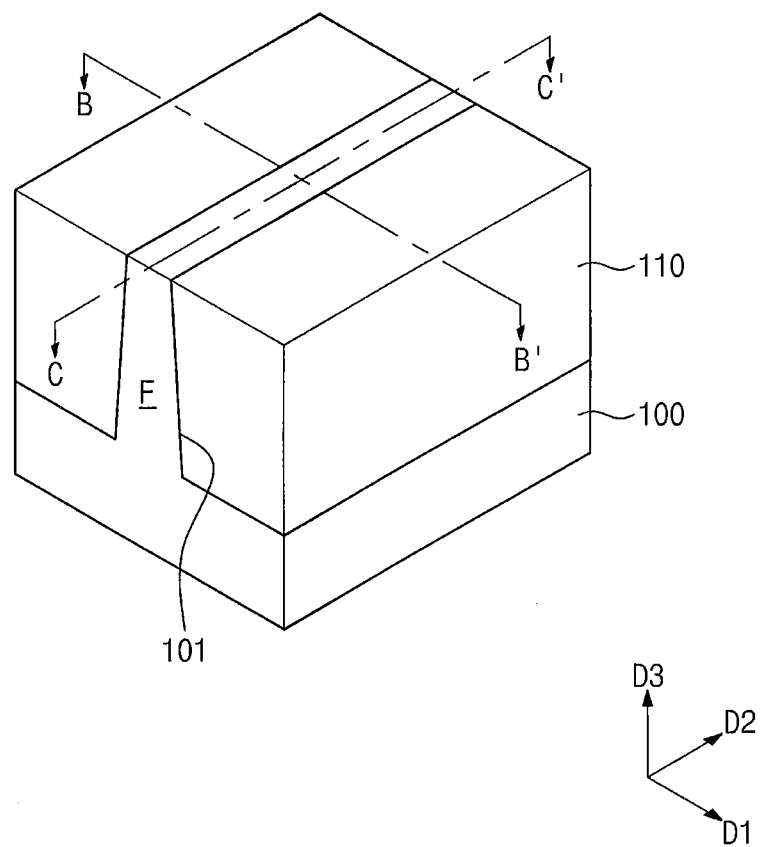
FIGS. 5A, 6A, 7A, and 8A are perspective views illustrating a process of forming a transistor according to some example embodiments of the inventive concept.
Figure 5B:
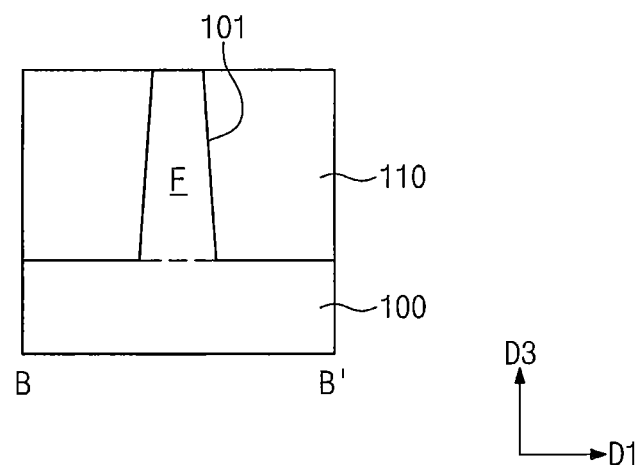
FIGS. 5B, 6B, 7B, and 8B are sectional views taken along lines B-B' of FIGS. 5A, 6A, 7A, and 8A, respectively.
Figure 5C:
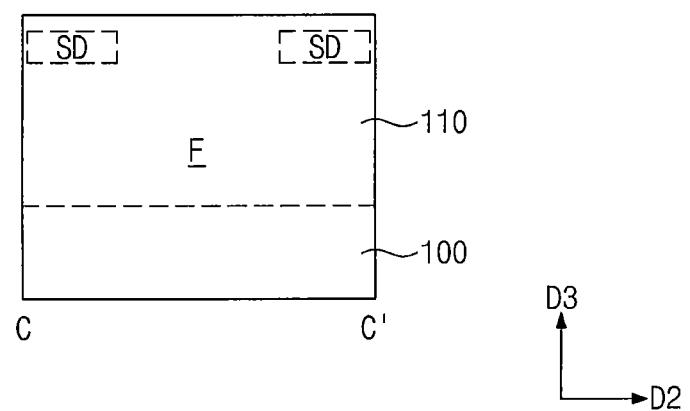
FIGS. 5C, 6C, 7C, and 8C are sectional views taken along lines C-C' of FIGS. 5A, 6A, 7A, and 8A, respectively.

Referring to FIGS. 5A through 5C, a fin portion F protruding from a substrate 100 may be formed. The substrate 100 may be a silicon wafer or a SOI wafer. A device isolation pattern 110 may be formed to fill a trench 101. The fin portion F, the device isolation pattern 110, and the source/drain regions SD may be formed using the same methods as described above as examples with reference to FIGS. 1A through 1C.

Figure 6A:
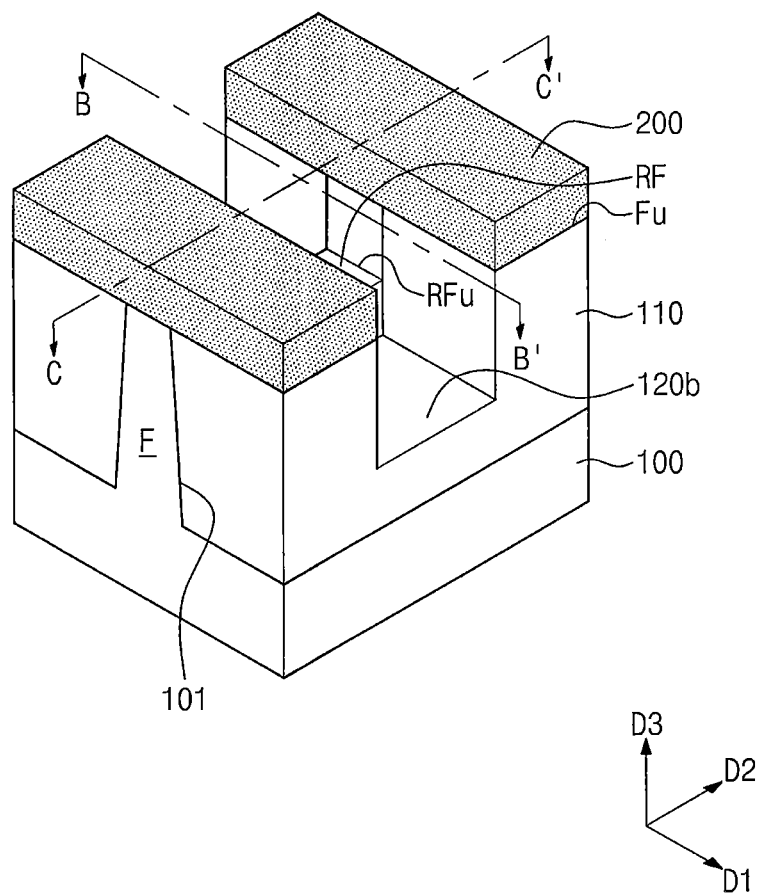
Figure 6B:
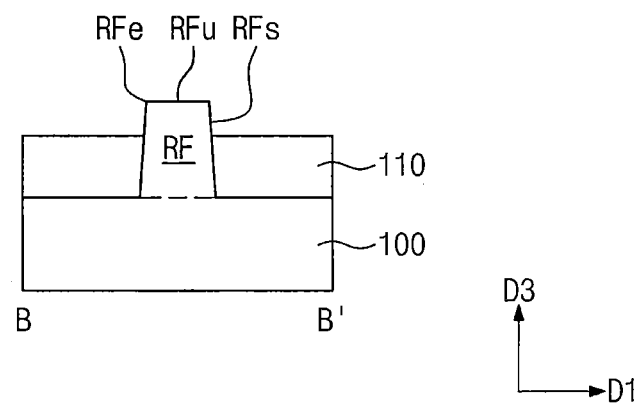
Figure 6C:
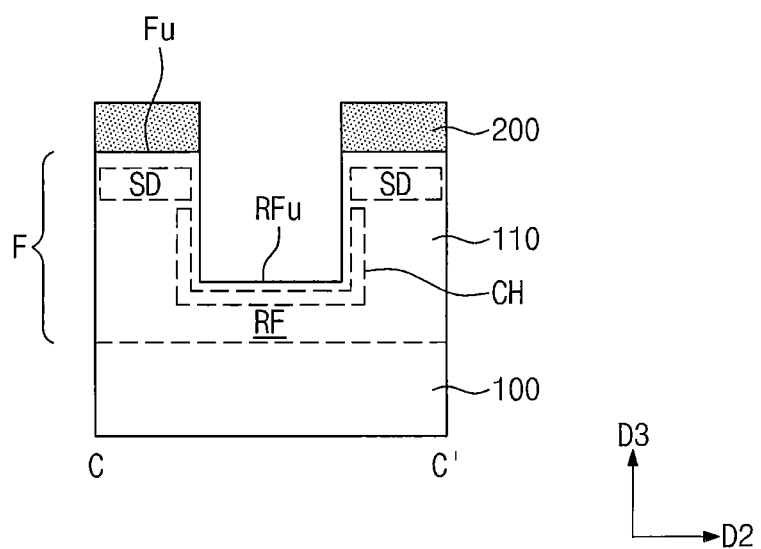

Referring to FIGS. 6A through 6C, a recessed fin portion RF and a gate trench 120 may be formed. For example, a mask pattern may be formed on the device isolation pattern 110. The mask pattern 200 may cover the source/drain regions SD of the fin portion F and expose at least a portion of the fin portion F, e.g., a channel region CH. The mask pattern 200 may expose a portion of the device isolation pattern 110. The exposed fin portion F and the device isolation pattern 110 may be etched using the mask pattern 200. An upper portion of the fin portion F exposed by the mask pattern 200 may be etched to form a recessed fin portion RF. The recessed fin portion RF may refer to a region of the fin portion F, which is exposed by the device isolation pattern 110 between the source/drain regions SD. The channel region CH may partially overlap the recessed fin portion RF. As shown in FIG. 6B, the recessed fin portion RF may be formed to have a small radius of curvature at edges RFe thereof. As shown in FIG. 6C, a top surface RFu of the recessed fin portion RF may be positioned at a lower level than top surfaces Fu of the source/drain regions SD of the fin portion F. Due to the recessed fin portion RF, it is possible to realize a higher threshold voltage and a longer effective channel length. Due to the etching of the device isolation pattern 110, the gate trench 120 may be formed. The gate trench 120 may be formed to expose both sidewalls RFs and the top surface RFu of the recessed fin portion RF. During the etching process, an etch rate of the fin portion F may be different from that of the device isolation pattern 110. As another example, an additional etching process may be performed on the device isolation pattern 110. The top surface RFu of the recessed fin portion RF may be positioned at a higher level than a bottom surface 120b of the gate trench 120.

Figure 7A:
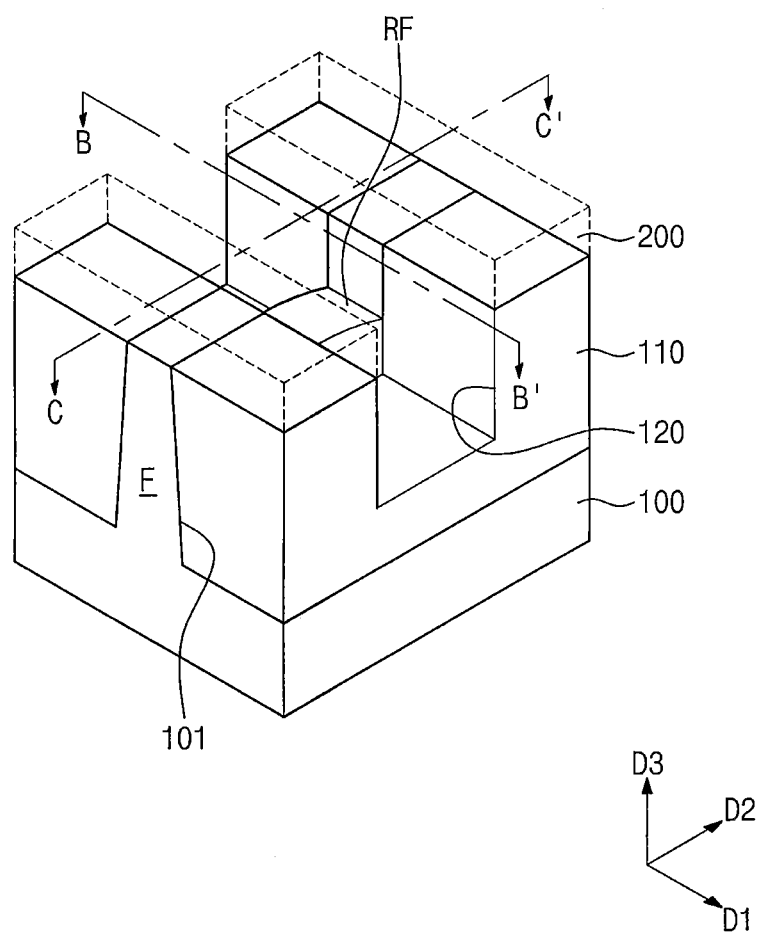
Figure 7B:
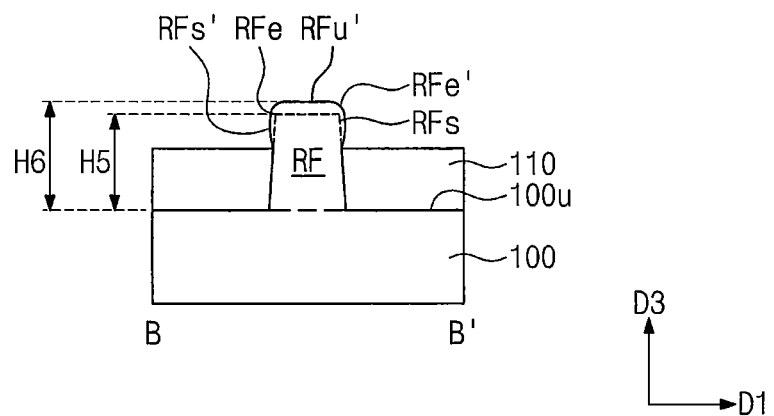
Figure 7C:
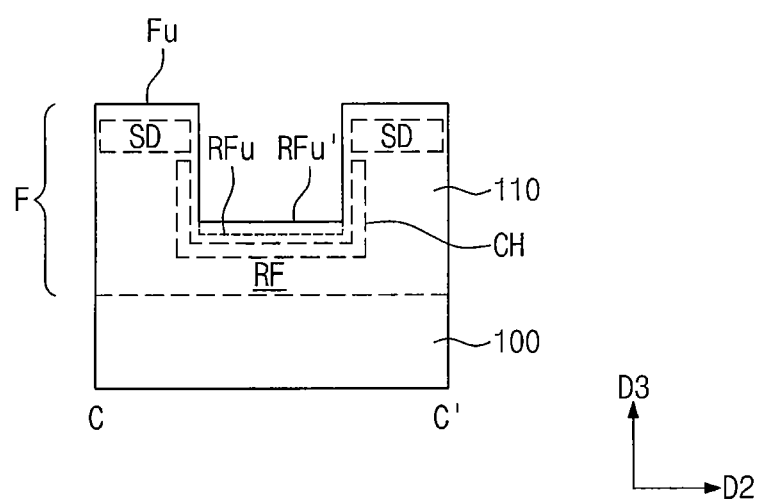

Referring to FIGS. 7A through 7C, a process of injecting a Group-IV element into the recessed fin portion RF may be performed to increase the volume of the recessed fin portion RF. The Group-IV element may be injected into a portion of the recessed fin portion RF exposed by the device isolation pattern 110. A height H6 of the recessed fin portion RF into which the Group-IV element has been injected may be greater than a height H5 of the recessed fin portion RF into which the Group-IV element has not been injected yet. Edges Fe' of the recessed fin portion RF into which the Group-IV element has been injected may be more rounded than edges Fe of the recessed fin portion RF into which the Group-IV element has not been injected yet. In some embodiments, the Group-IV element may be injected into the channel region CH of the recessed fin portion RF at a dose of about $5\times10^{19}$ atoms/cm$^3$ to about $5\times10^{21}$ atoms/cm$^3$, specifically, a dose of about $5\times10^{29}$ atoms/cm$^3$. The Group-IV element may contain silicon, germanium, and/or carbon. For example, a surface portion of the recessed fin portion RF may contain a Group-IV element (e.g., silicon, germanium and/or carbon) at a higher concentration than a core portion of the recessed fin portion RF. Unlike dopants such as Group-III or V elements, the Group-IV element may not affect threshold voltage characteristics of the channel region. In example embodiments, the Group-IV element may be injected in a direction normal (e.g., perpendicular) to a top surface 100u of the substrate 100. In some example embodiments, the Group-IV element may be injected in a direction that is at an angle to the top surface 100u of the substrate 100. In some example embodiments, the Group-IV element may be simultaneously injected into the fin portion F in the direction normal (e.g., perpendicular) to the top surface 100u of the substrate 100 and in the tilted directions. In some example embodiments, the Group-IV element may be injected into the recessed fin portion RF in the direction normal (e.g., perpendicular) to the top surface 100u of the substrate 100, and then, the Group-IV element may be injected into the recessed fin portion RF in tilted directions with respect to the direction normal (e.g., perpendicular) to the top surface 100u of the substrate 100.

After the Group-IV element is injected, a process of crystallizing the recessed fin portion RF may be performed. For example, the recessed fin portion RF may be crystallized using a solid-phase epitaxy (SPE) process. According to example embodiments of the inventive concept, the recessed fin portion RF may be formed to have an increased channel width. Accordingly, on-current characteristics of a transistor may be improved.

The Group-IV element may not be injected into the source/drain regions SD of the fin portion F. Accordingly, the volumes of the source/drain regions SD of the fin portion F may not increase during the injection of the Group-IV element.

A dopant may be further injected into the recessed fin portion RF. The dopant may be a Group-III element or a Group-V element. The dopant injection process may be performed using the same method as described above. As another example, the process of injecting the dopant may be omitted. Thereafter, the mask pattern 200 may be removed.

Figure 8A:
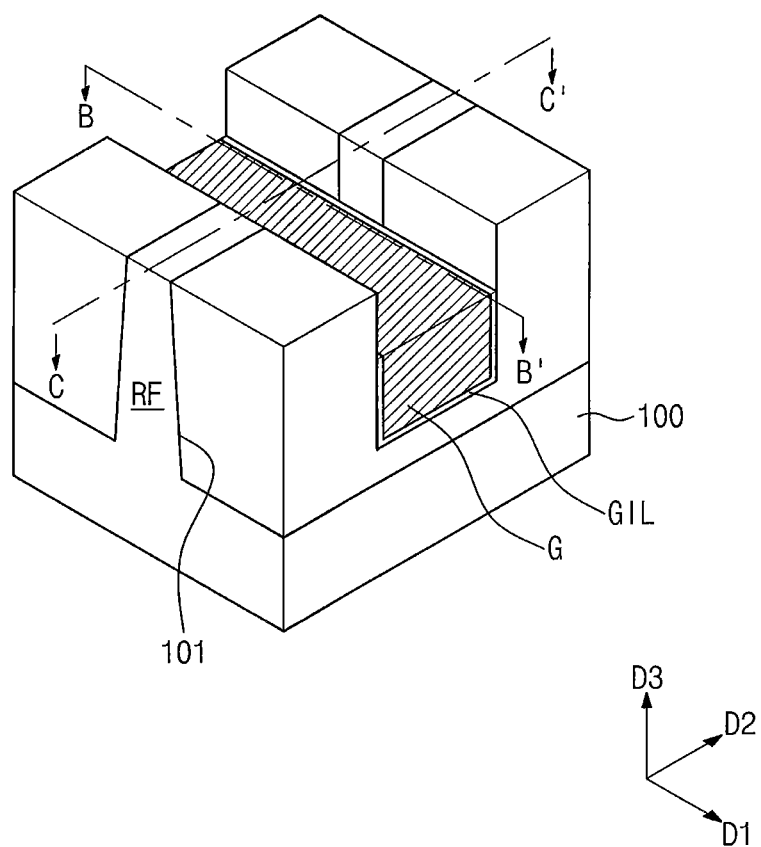
Figure 8B:
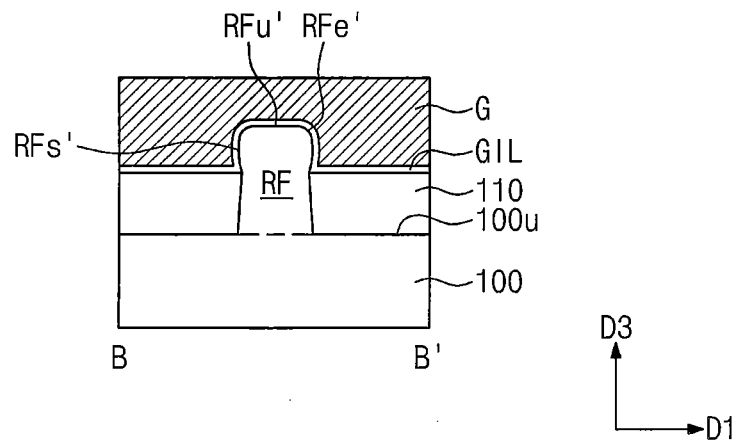
Figure 8C:
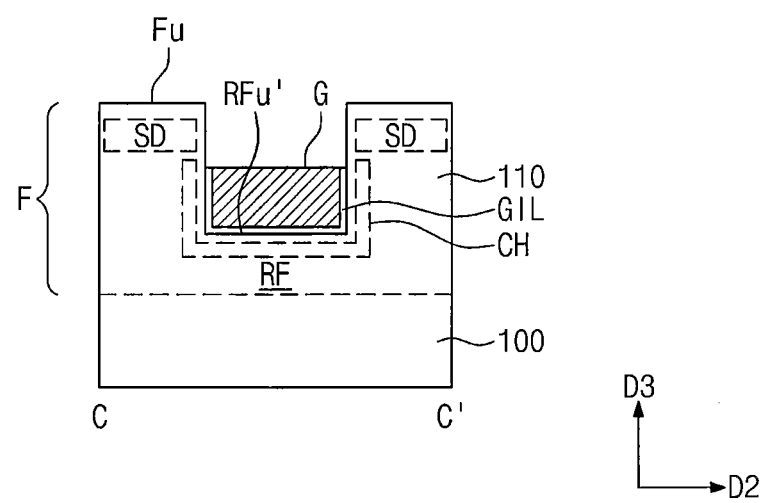

Referring to FIGS. 8A through 8C, a gate insulating layer GIL and a gate electrode G may be sequentially formed within the gate trench 120. A top surface of the gate electrode G may be positioned at the same level as or a lower level than that of the device isolation pattern 110. Since edges RFe' of the recessed fin portion RF are rounded, the gate insulating layer GIL of the inventive concept may be formed to have improved thickness uniformity. An upper portion of the recessed fin portion RF may correspond to the channel region CH. The concentration of an electric field into the edges RFe' of the recessed fin portion RF may be prevented/reduced/impeded. Accordingly, threshold voltage characteristics and reliability of the transistor may be improved.

Figure 9:
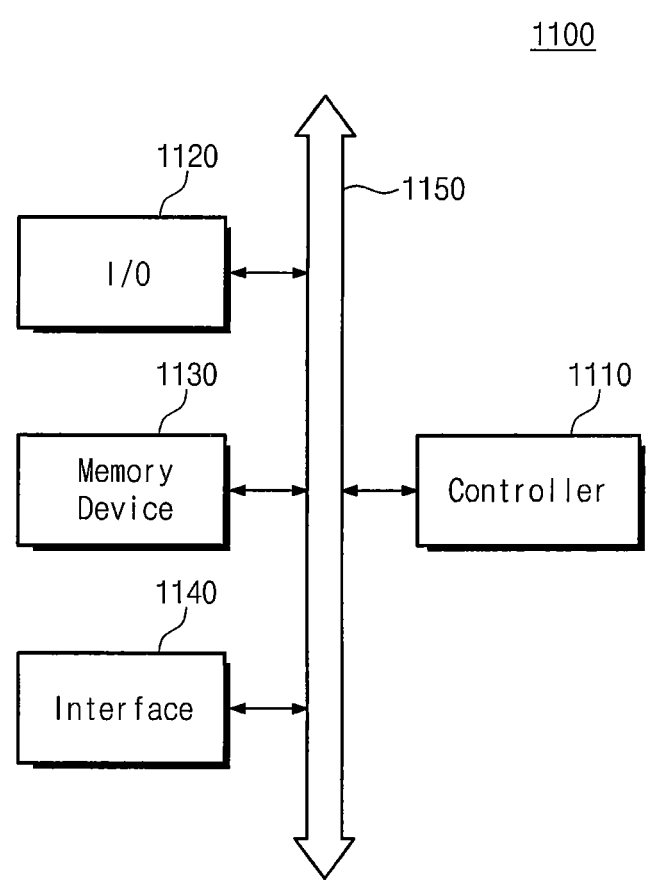
FIG. 9 is a schematic block diagram illustrating an example of electronic systems including a transistor according to example embodiments of the inventive concept.

FIG. 9 is a schematic block diagram illustrating an example of electronic systems including a transistor according to example embodiments of the inventive concept.

Referring to FIG. 9, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. In this case, the controller 1110 may include at least one of the afore-described transistors. The I/O unit 1120 may include a keypad, a keyboard or a display unit. The memory device 1130 may store data and/or commands. In example embodiments, the memory device 1130 may include one of nonvolatile memory devices, such as FLASH, magnetic, and/or phase-changeable memory devices. For example, the memory device 1130 may be a nonvolatile memory device including at least one of the afore-described transistors. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110. In this case, the cache memory may be configured to include at least one of the afore-described transistors.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 10:
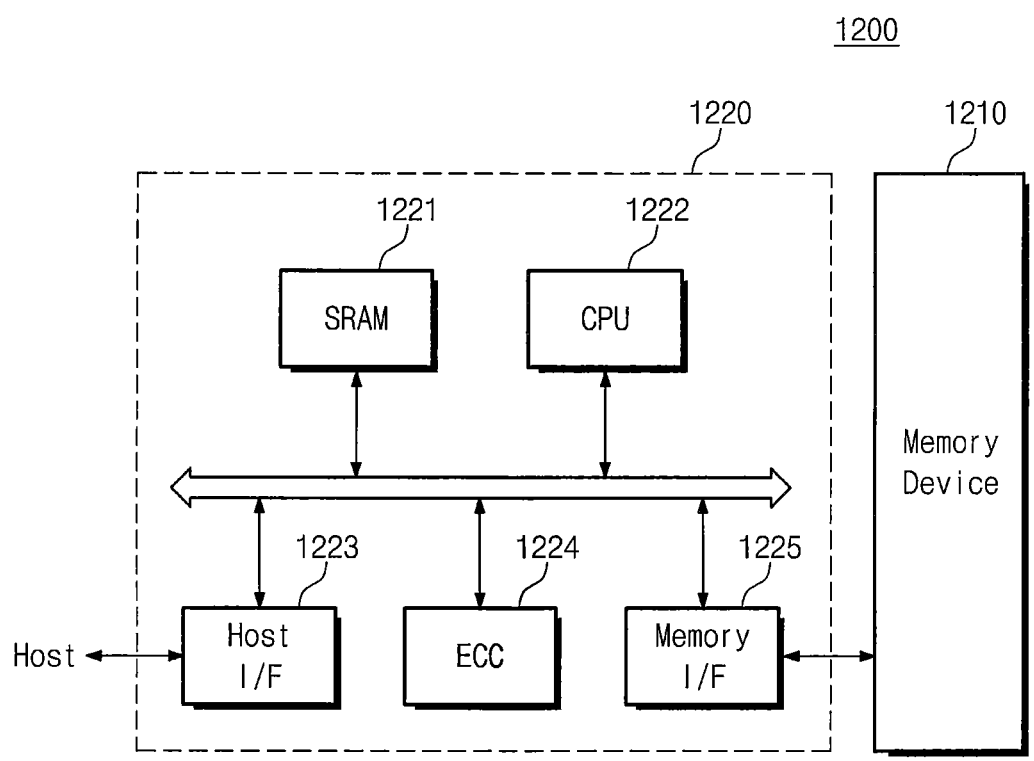
FIG. 10 is a schematic block diagram illustrating an example of a memory card including a transistor according to example embodiments of the inventive concept.

FIG. 10 is a schematic block diagram illustrating an example of memory systems including a transistor according to the embodiments of the inventive concept.

Referring to FIG. 10, a memory system 1200 according to example embodiments of the inventive concept may include a memory device 1210. The memory device 1210 may be, for example, one of nonvolatile memory devices, such as FLASH, magnetic, and/or phase-changeable memory devices, including at least one of the afore-described transistors. The memory system 1200 may include a memory controller 1220 that controls data communication between a host and the memory device 1210.

The memory controller 1220 may include a processing unit 1222 that controls overall operations of the memory system 1200. The processing unit 1222 may include at least one of the afore-described transistors. In addition, the memory controller 1220 may include an SRAM device 1221 used as an operation memory of the processing unit 1222. The SRAM device 1221 may include at least one of the afore-described transistors. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. Alternatively, the memory system 1200 may be provided in the form of solid state disks (SSD), instead of hard disks of computer systems.

According to example embodiments of the inventive concept, the volume of a fin portion can be increased by injecting a Group-IV element to a channel region of the fin portion. Accordingly, the fin portion can be formed to have an increased channel width, and a transistor can have improved on-current characteristics. Further, by injecting the Group-IV element, an edge of the fin portion can be rounded. As a result, it is possible to prevent/impede an electric field from being concentrated at an edge portion of a channel, during operations of the transistor. The transistor can be formed to have improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming a transistor, the method comprising:
   forming a fin portion protruding upward from a substrate;
   forming a device isolation pattern on the substrate to cover a sidewall of the fin portion;
   forming a trench in the device isolation pattern, the trench exposing a top surface and sidewalls of a channel region of the fin portion; and
   recessing the channel region to form a first recessed channel region of which a top surface is lower than top surfaces of source/drain regions at both sides of the fin portion; and
   injecting a Group-IV element into the first recessed channel region of the fin portion to form a second recessed channel region, wherein a volume of the second recessed channel region of the fin portion is larger than a volume of the first recessed channel region, wherein a top surface of the second recessed channel region of the fin portion is lower than top surfaces of source/drain regions of the fin portion.

2. The method of claim 1, wherein injecting the Group-IV element comprises increasing the volume of the first recessed channel region and increasing a roundness of an edge of the fin portion by injecting the Group-IV element.

3. The method of claim 1, wherein injecting the Group-IV element comprises injecting the Group-IV element into the first recessed channel region at a dose of about $5 \times 10^{19}$ atoms/cm$^3$ to about $5 \times 10^{21}$ atoms/cm$^3$.

4. The method of claim 1, wherein injecting the Group-IV element comprises injecting the Group-IV element at a tilted angle with respect to a direction perpendicular to a top surface of the substrate.

5. The method of claim 1, further comprising crystallizing the fin portion after injecting the Group-IV element.

6. The method of claim 1, further comprising:
   forming a gate insulating layer within the trench, the gate insulating layer covering a top surface and sidewalls of the second recessed channel region of which the volume has increased; and
   forming a gate electrode on the gate insulating layer, wherein the top surfaces of the gate electrode are lower than top surfaces of the source/drain regions of the fin portion.

7. The method of claim 1, wherein injecting the Group-IV element comprises injecting a Group-IV element that comprises silicon, germanium, and/or carbon.

8. The method of claim 1,
   wherein the fin portion comprises a lower portion covered with the device isolation pattern and an upper portion exposed by the device isolation pattern,
   wherein injecting the Group-IV element comprises injecting the Group-IV element into the upper portion of the fin portion, and
   wherein, after injecting the Group-IV element into the upper portion of the fin portion, a first width of the upper portion of the fin portion is wider than a second width of the lower portion of the fin portion.

9. The method of claim 1 wherein the Group-IV element comprises a Group IV element other than Ge.

10. A method of forming a transistor, the method comprising:
forming a fin portion protruding upward from a substrate;
forming a mask pattern that is on first and second regions of the fin portion and that exposes a channel region of the fin portion that is between the first and second regions;
rounding an edge of the channel region and increasing a volume of the channel region by injecting a Group-IV element into the channel region; and
forming a gate electrode on the channel region after rounding the edge of the channel region.

11. The method of claim 10, further comprising crystallizing the channel region, after injecting the Group-IV element into the channel region.

12. The method of claim 10, wherein injecting the Group-IV element comprises injecting the Group-IV element using a tilted ion injection technique.

13. The method of claim 10, further comprising forming a gate insulating layer between the channel region of the fin portion and the gate electrode, the gate insulating layer extending along the rounded edge of the channel region.

14. The method of claim 10, further comprising recessing the channel region below the first and second regions of the fin portion, before rounding the edge of the channel region.

15. The method of claim 10, a height of the channel region of the fin portion is higher than a height of the source/drain regions of the fin portion after injecting the Group-IV element.

16. A method of forming a transistor, the method comprising:
forming a fin portion protruding upward from a substrate of an element from Group-IV;
forming a device isolation pattern on the substrate to cover a sidewall of the fin portion;
forming a trench in the device isolation pattern, the trench exposing a top surface and sidewalls of a channel region of the fin portion; and
implanting the channel region of the fin portion with the element from Group-IV,
wherein implanting the channel region of the fin portion with the element from Group-IV rounds an edge of the channel region and increases a volume of the channel region,
wherein an edge of the channel region of the fin portion is more round than an edge of the source/drain regions of the fin portion by injecting the Group-IV element.

17. The method of claim 16 wherein forming the fin portion comprise the Group-IV comprises forming the fin portion of Si and implanting the channel region of the fin portion with the element from Group-IV comprises implanting the channel region of the fin portion with Si.

18. The method of claim 16 wherein implanting the channel region of the fin portion with the element from Group-IV comprises implanting the channel region of the fin portion with the element from Group-IV at a dose of about $5 \times 10^{19}$ atoms/cm$^3$ to about $5 \times 10^{21}$ atoms/cm$^3$.

* * * * *